United States Patent [19]

Lewis et al.

[11] Patent Number: 4,803,537
[45] Date of Patent: Feb. 7, 1988

[54] INFRARED DETECTOR SYSTEM BASED UPON GROUP III-V EPITAXIAL MATERIAL

[75] Inventors: Adam J. Lewis; William R. Frensley, both of Richardson, Tex.

[73] Assignee: Texas Instruments Incorporated, Dallas, Tex.

[21] Appl. No.: 170,604

[22] Filed: Mar. 14, 1988

Related U.S. Application Data

[63] Continuation of Ser. No. 926,814, Oct. 31, 1986, abandoned, which is a continuation of Ser. No. 570,463, Jan. 13, 1984, abandoned.

[51] Int. Cl.$^4$ .................... H01L 27/14; H01L 31/00
[52] U.S. Cl. ....................................................... 357/30
[58] Field of Search .................... 357/30; 136/252, 262

[56] References Cited

U.S. PATENT DOCUMENTS

| | | | |
|---|---|---|---|
| 4,257,055 | 3/1981 | Hess et al. | 357/30 |
| 4,278,474 | 7/1981 | Blakeslee et al. | 357/30 |
| 4,450,567 | 5/1984 | Seifres et al. | 357/30 |

Primary Examiner—William L. Sikes
Assistant Examiner—Robert E. Wise
Attorney, Agent, or Firm—Carlton H. Hoel; Leo N. Heiting; Melvin Sharp

[57] ABSTRACT

The disclosure relates to a detector of infrared radiation which employs Group III-V compound semiconductor technology and includes a conductive substrate, of a material such as GaAs. Upon this substrate is deposited a lattice structure, including thin alternating layers of a wider and a narrower energy band gap material (AlGaAs and GaAs) periodically disposed. Upon this is deposited a layer of an alloyed semiconductor of moderate bandgap, into which photoexcited carriers are injected, and upon this is deposited a layer of wider bandgap material against which the carriers are trapped and thus collected. The lattice is designed so that the energy gap between the first two bands produced by the periodic structure is equal to the infrared photon energy. The doping is such as to nearly fill the first band with free carriers. Thus infrared radiation is efficiently absorbed, generating free carriers in the second band of the lattice. The bandgap of the next layer is chosen so that these photoexcited carriers may easily pass into this layer, while those in the lower-energy band are blocked. These carriers are propelled across this next layer by an applied electric field and are collected at the interface with a wide-gap layer.

6 Claims, 2 Drawing Sheets

INFRARED DETECTOR SYSTEM BASED UPON GROUP III-V EPITAXIAL MATERIAL

This application is a continuation of 926,814 filed 10-31-86, now abandoned, which is a continuation of 570,463 filed 1-13-84, now abandoned.

BACKGROUND OF THE INVENTION

1. Field of the Invention

This invention relates to an infrared detector device for detecting infrared radiation which employs a Group III-V compound semiconductor material.

2. Description of the Prior Art

There presently exists a large market for systems which can detect infrared radiations, especially for night vision. Detector systems for infrared radiations are well known in the prior art and exist in many different forms. Infrared radiation detection systems which have found a great deal of acceptance in recent years have been based upon an alloy of mercury, cadmium and tellurium in stoichiometric amounts with the ratio of mercury to cadmium being adjustable to tune the material to the frequency of the infrared radiation. Such materials are known in the art as HgCdTe to include the broad spectrum of these materials. These HgCdTe materials are presently in preferred materials for second generation infrared detection systems.

Despite the great acceptance of the prior art mercury, cadmium, telluride materials, these materials are subject to certain problems such as, material size and purity, maturity of integrated circuit technology for substrates in other materials, the relatively high dark currents encountered compared to the optical currents, the relative instability of the surfaces thereof due to anodic oxidation which provides interfaces that are unable to stand up to 100° C. environmental conditions, and the like. It is therefore desirable that, not only should the prior art HgCdTe technology be improved, but also, it is desirable that other materials be explored for infrared detectors which have properties superior to those found in existing systems.

SUMMARY OF THE INVENTION

In accordance with the present invention, there is provided a detector for infrared radiation which is based upon Group III-V technology, utilizing specifically gallium arsenide and aluminum gallium arsenide. Two different compositions of (AlGa) As are used, forming two heterojunctions. The heterojunction nearer the substrate is designed to have a conduction band energy barrier less than the infrared photon energy. Electrons are photoexcited over the barrier to be collected at the second heterojunction, the latter having a much larger conduction band barrier. The charge collected at the latter heterojunction is read out as the image signal. A slope discontinuity is provided in the conduction band which is the result of a sheet of negative charge at the latter heterojunction. This charge forms naturally as an excess of electrons is trapped at the heterojunction.

While such a structure will provide the desired result, the problem with such an infrared imaging structure is that its quantum efficiency is low, the reason being that an attempt is being made to photoexcite a nearly free carrier (electron) and such a procedure does not satisfy conservation of energy and momentum. The photon, being a massless particle, has a very low momentum in relation to its energy. If the photon is to be completely absorbed, transferring all of its energy to an electron, that electron must gain a large momentum. In a crystal, this generally requires that phonons be involved in the process.

In order to provide a higher quantum efficiency from a direct photon absorption process, the gallium arsenide infrared absorbing layer is replaced with an artificial structure which is a superlattice wherein the continuous energy bands and the conduction band are split up with very small gaps due to the periodic (lattice) structure to provide a band structure similar to that of HgCdTe. The lattice structure is preferably composed of N-type doped gallium arsenide wherein, at spaced intervals, aluminum replaces some of the gallium sites. The spacing between the spaced sites is determined by the frequency of the infrared radiations to be detected.

The infrared detector in accordance with the present invention comprises a conductive substrate of a Group III-V material, preferably gallium arsenide. Upon this substrate is deposited the above described superlattice-type structure of alternating thin layers of a wider and then a narrower energy band gap material, aluminum gallium arsenide and gallium arsenide being the preferable materials. Upon this superlattice structure there is deposited a layer of an alloyed semiconductor material of moderate band gap, aluminum gallium arsenide being the preferred material, into which photo-excited carriers are injected. Upon this layer is deposited a further layer of wider band gap material, aluminum gallium arsenide with different aluminum-gallium ratio being preferred.

The superlattice structure is designed so that the energy gap between the first two "mini-bands", produced by the periodic lattice structure is equal to the infrared photon energy. The doping is such as to nearly fill the first "mini-band" with free carriers. Thus, infrared radiation will be efficiently absorbed, generating free carriers in the second mini-band, etc. The band gap of the next layer is chosen so that these photo excited carriers may easily pass over the heterojunction into this layer, while those in the lower energy mini-band are blocked. These carriers are propelled across the layer by an applied electric field and are collected at the interface or heterojunction with the next wide-gap layer. A metal gate electrode is provided over an insulator at the top surface of the device. The above described device displays clear advantages over the prior art mercury cadmium telluride infrared detectors in that large area substrates can be provided, and more mature integrated circuit technology is available and a more stable interface for charge storage is provided. In addition dark currents are significantly smaller than the optical currents.

DESCRIPTION OF THE PREFERRED EMBODIMENT

Figure 1:
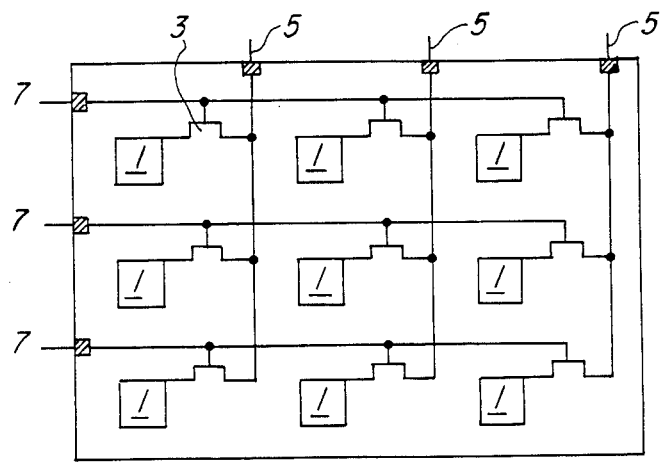
FIG. 1 is a circuit diagram of an imaging device using the photocapacitor detectors in accordance with the present invention.

Referring first to FIG. 1, there is shown a typical infrared imaging device having a plurality of infrared detector cells 1 formed on a substrate of gallium arsenide 11 (FIG. 2), which is undoped or slightly doped, each of the cells being coupled via an FET device 3 to column lines 5 and row lines 7 in a matrix arrangement whereby any one of the cells 1 can be addressed in well known manner.

Figure 2:
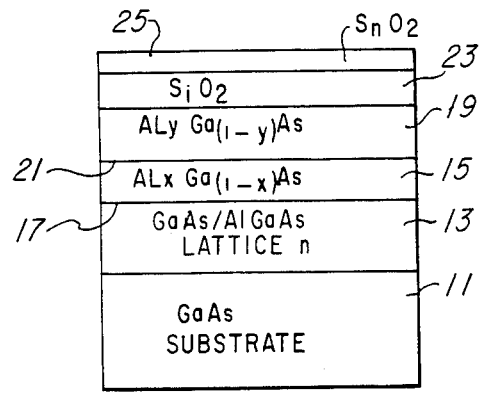
FIG. 2 is a schematic diagram of a photocapacitor detector in accordance with the present invention.

As shown in FIG. 2, each of the cells 1 includes a substrate of gallium arsenide 11 of either undoped or very lightly doped type. An N-type gallium arsenide superlattice 13 is formed over the substrate 11 having a superlattice structure wherein aluminum replaces some of the gallium at various levels between the substrate 11 and the layer 15 as will be explained in greater detail hereinbelow. The interface of the layer 13 and the layer 15 is provided by an aluminum discontinuity wherein a predetermined amount of aluminum is continuously added to replace some of the gallium sites and form an aluminum gallium arsenide heterojunction 17. The junction 17 confines the electrons extant in the lattice structure 13 therein. A further aluminum gallium arsenide layer 19 is provided with a sudden increase in the amount of aluminum provided at the heterojunction 21 between the layers 15 and 19. This sudden jump increase in the amount of aluminum in the layer provides a collection point so that electrons which are photoexcited over the heterojunction 17 into the layer 15 will be collected against the barrier formed at the heterojunction 21. An insulating layer 23 is provided over the layer 19, silicon dioxide being a preferred insulator and a transparent conductive layer 25 is formed over the insulating layer 23, tin oxide and indium tin oxide (ITO) being preferred materials for this purpose.

Figure 3:
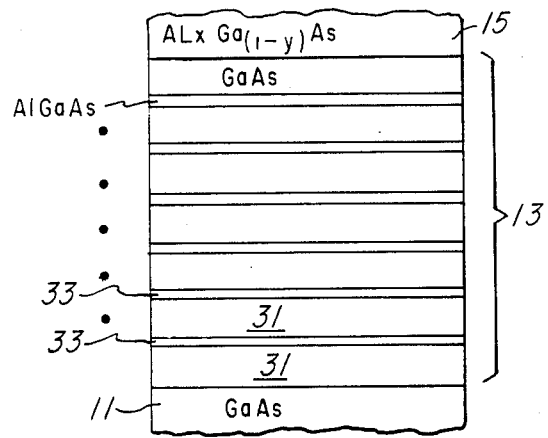
FIG. 3 is an enlarged view of layer 13 of the detector of FIG. 2.

Referring now to FIG. 3, the layer 13 and its superlattice structure is shown in greater detail. As can be seen, a layer of N-type doped gallium arsenide 31 is formed over the substrate 11, preferably by molecular beam epitaxy (MBE) to a predetermined layer height whereupon aluminum is added to the deposit to form a thin layer of aluminum gallium arsenide 33. This procedure continues on an alternating basis for the entire height of the layer 13. The regions with aluminum 33 are equally spaced from each other and the spacing therebetween is determined by the wave length of the infrared radiations to be received, it being apparent that the layer 13 is tuned to the frequency of radiation to be detected. The structure of FIG. 3 provides a high degree of efficiency to the detector element.

Figure 4:
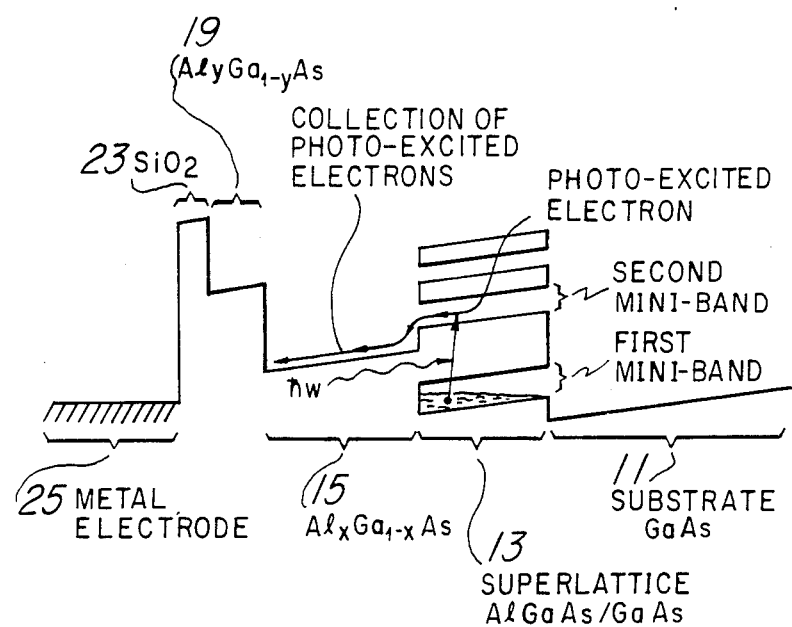
FIG. 4 is a graph of the conduction band profile of the detector of FIGS. 2 and 3.

In actual operation, photons of infrared radiation will impinge upon the layer 13 and excite electrons therein by transfer of energy thereto. Those electrons that receive sufficient energy from the photons will be able to scale the barrier or heterojunction 17 between the layer 13 and the layer 15 as shown in FIG. 4 and move into the layer 15 by traveling over the barrier 17. The electrons that travel into layers 15 will then be collected against the heterojunction or barrier 21 which is the interface between the layers 15 and 19. With the electrons collected at the barrier 21, it can be seen that an appropriate sensing of the cell by the row and column lines 5 and 7 as shown in FIG. 1 will cause detection of the charge on each of the formed capacitors to be sensed without loading the sense line down with capacitance from the addressed row.

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modifications.

We claim:

1. A semiconductor detector for infrared radiation, comprising:
   (a) an absorption superlattice with first and second mini-bands, said mini-bands separated by an energy about equal to the energy of the photons of a frequency of infrared radiation to be detected, said superlattice with carriers in said first mini-band but not in said second mini-band;
   (b) a collector abutting said superlattice, said collector with energy band edge between said mini-bands at said superlattice so carriers in said first mini-band are blocked from said collector but carriers photo-excited by said infrared radiation from said first mini-band to said second mini-band can pass into said collector; and
   (c) a sensor coupled to said collector to detect carriers in said collector.

2. The detector of claim 1, wherein:
   (a) said superlattice is made of alternating layers of gallium arsenide and a first aluminum gallium arsenide alloy;
   (b) said collector includes a second aluminum gallium arsenide alloy abutting said superlattice; and
   said sensor includes an insulated transparent conductive gate electrode on said collector.

3. The detector of claim 2, wherein:
   (a) said carriers are electrons;
   (b) said superlattice is doped N type;
   (c) said gate electrode is made of material selected from the group consisting of tin oxide and indium tin oxide; and
   (d) said gate electrode is insulated on said collector by silicon dioxide.

4. An infrared imaging device for detecting infrared radiation, comprising:
   (a) a plurality of infrared detectors arranged into rows and columns, each of said detectors including:
      i. an absorption superlattice with first and second mini-bands, said mini-bands separated by an energy about equal to the energy of the photons of a frequency of infrared radiation to be detected, said superlattice with carriers in said first mini-band but not in said second mini-band;
      ii. a collector abutting said superlattice, said collector with energy band edge between said mini-bands at said superlattice so carriers in said first mini-band are blocked from said collector but carriers photo-excited by said infrared radiation from said first mini-band to said second mini-band can pass into said collector; and
      iii. a sensor coupled to said collector to detect carriers in said collector; and
   (b) circuitry for addressing each of said detector sensors.

5. The device of claim 4, wherein:
   (a) said superlattice is made of alternating layers of gallium arsenide and a first aluminum gallium arsenide alloy;

(b) said collector includes a second aluminum gallium arsenide alloy abutting said superlattice; and
(c) said sensor includes an insulated transparent conductive gate electrode on said collector.

6. The detector of claim 5, wherein:
(a) said carriers are electrons;
(b) said superlattice is doped N type;
(c) said gate electrode is made of material selected from the group consisting of tin oxide and indium tin oxide; and
(d) said gate electrode is insulated on said collector by silicon dioxide.

* * * * *